(12) United States Patent
Suzuki et al.

(10) Patent No.: US 7,235,141 B2
(45) Date of Patent: Jun. 26, 2007

(54) LIFT-OFF METHOD AND CHEMICAL LIQUID TANK

(75) Inventors: Masaru Suzuki, Aichi-ken (JP); Yoshiki Nitta, Tokyo-to (JP); Kazuhiko Ohmuro, Saitama-ken (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/111,860

(22) Filed: Apr. 22, 2005

(65) Prior Publication Data

US 2005/0183753 A1 Aug. 25, 2005

Related U.S. Application Data

(62) Division of application No. 10/262,950, filed on Oct. 3, 2002, now Pat. No. 6,962,630.

(30) Foreign Application Priority Data

Nov. 9, 2001 (JP) ............................. 2001-345226

(51) Int. Cl.
*B08B 3/00* (2006.01)
(52) U.S. Cl. ..................... 134/34; 134/2; 134/25.4; 134/42; 216/40; 438/745; 438/747; 438/906
(58) Field of Classification Search ............... 134/2, 134/34, 25.4, 42; 438/906, 745, 747; 216/40
See application file for complete search history.

(56) References Cited

U.S. PATENT DOCUMENTS

| 4,186,032 A | * | 1/1980 | Ham .............................. 134/31 |
| 4,655,162 A | * | 4/1987 | Kameyama .................... 118/50 |
| 5,423,131 A | * | 6/1995 | Shibano ........................ 34/105 |
| 5,908,042 A |   | 6/1999 | Fukunaga et al. |
| 6,182,675 B1 | * | 2/2001 | Naka et al. .................... 134/61 |
| 6,684,889 B2 | * | 2/2004 | Cavazza ....................... 134/1.3 |

FOREIGN PATENT DOCUMENTS

| JP | 05-062962 |   | 3/1993 |
| JP | 5-62962 | * | 3/1993 |
| JP | 10-004093 |   | 1/1998 |
| JP | 10-4093 | * | 1/1998 |
| JP | 10-177988 | * | 6/1998 |
| JP | 2000025205 | * | 7/1998 |
| JP | 11-135471 | * | 5/1999 |
| JP | 2001-257256 | * | 9/2001 |

* cited by examiner

*Primary Examiner*—M. Kornakov
(74) *Attorney, Agent, or Firm*—Rabin & Berdo, PC

(57) ABSTRACT

A lift-off procedure is provided which enables prevention of damage to a wiring pattern caused by contact of a metal being peeled off from a wafer with a wiring pattern at a time of lift-off procedure. A wafer having a surface on which a pattern is formed which contains a pattern portion to be removed is soaked into a chemical liquid at an angle at which the surface faces downward.

16 Claims, 9 Drawing Sheets

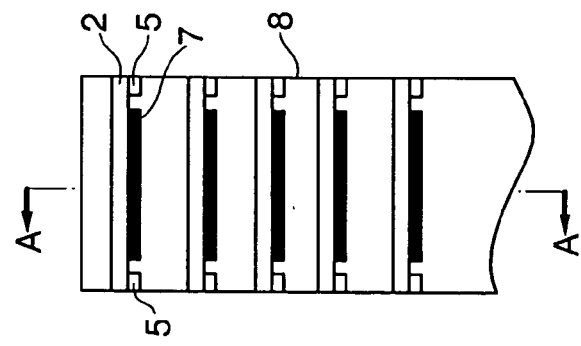
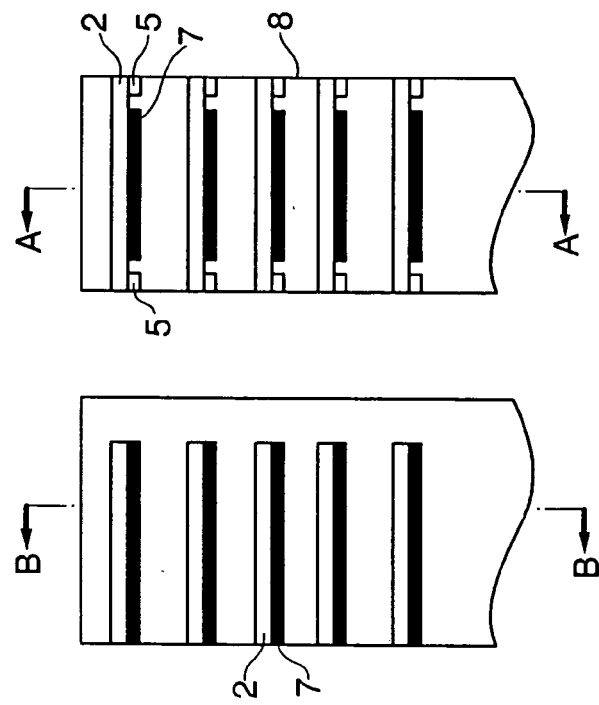
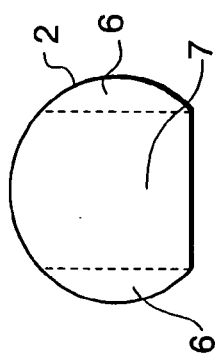
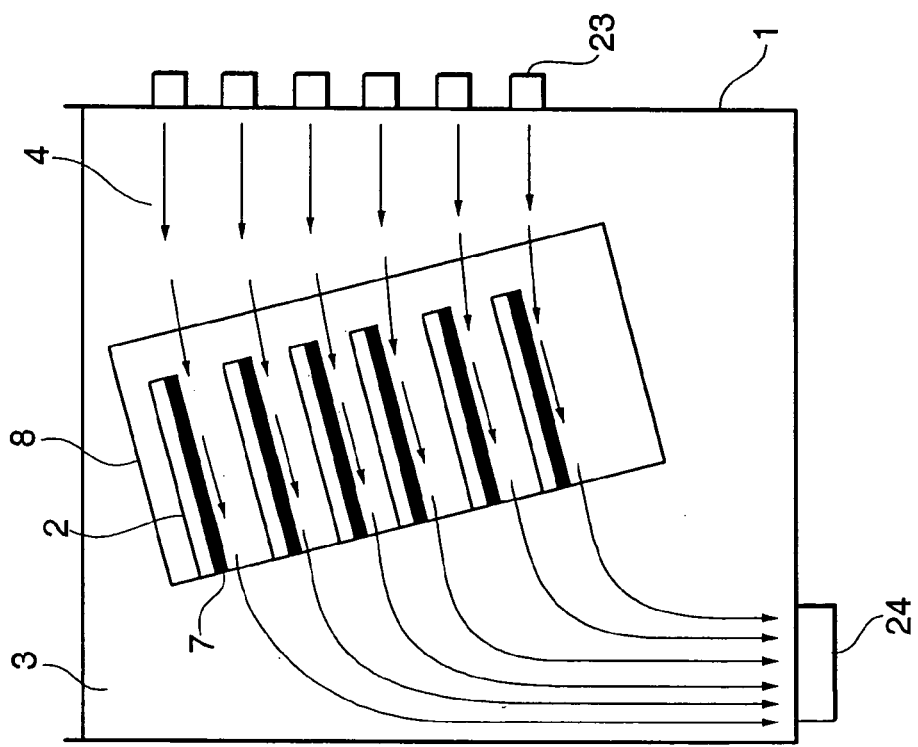

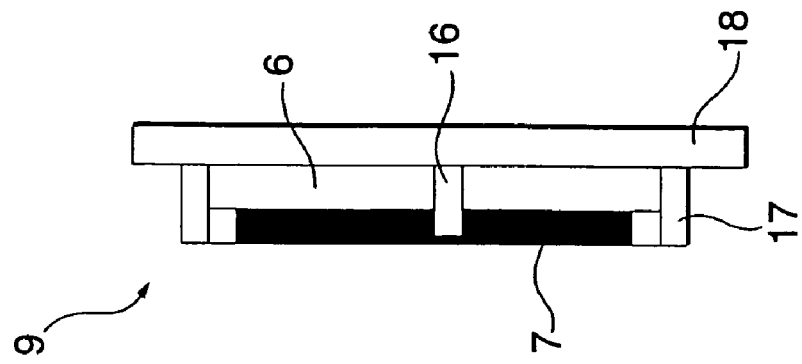
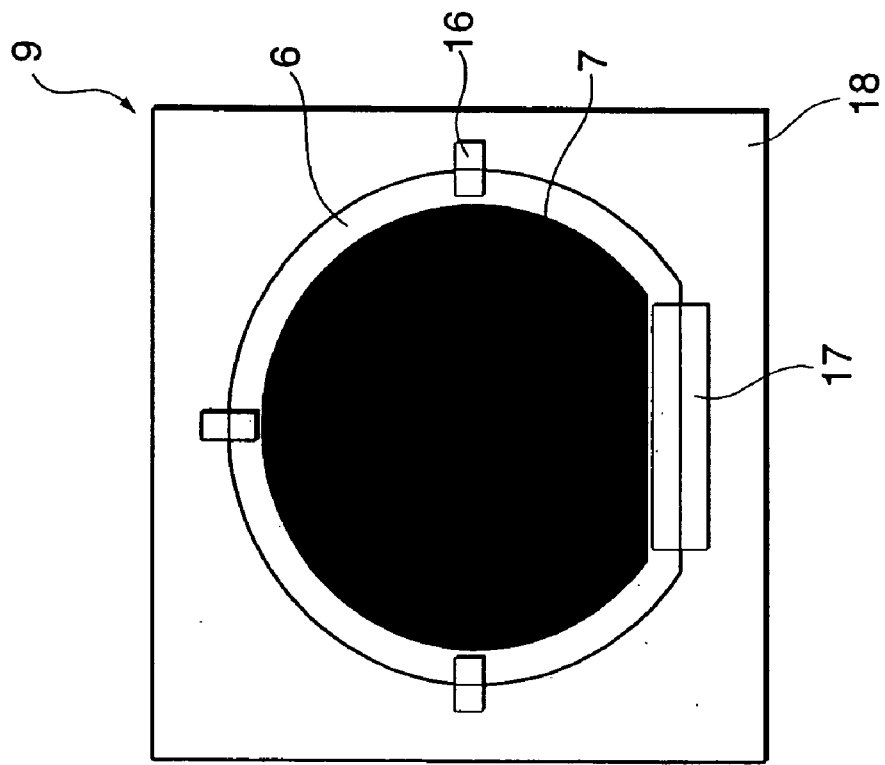
Fig.4(a)
Fig.4(b)

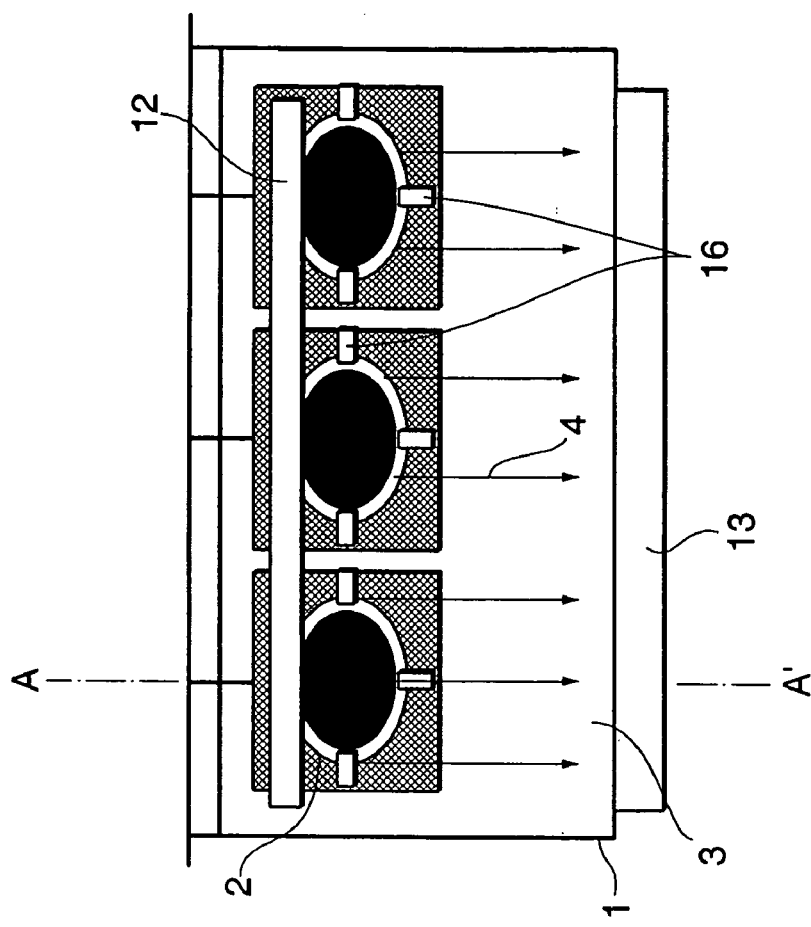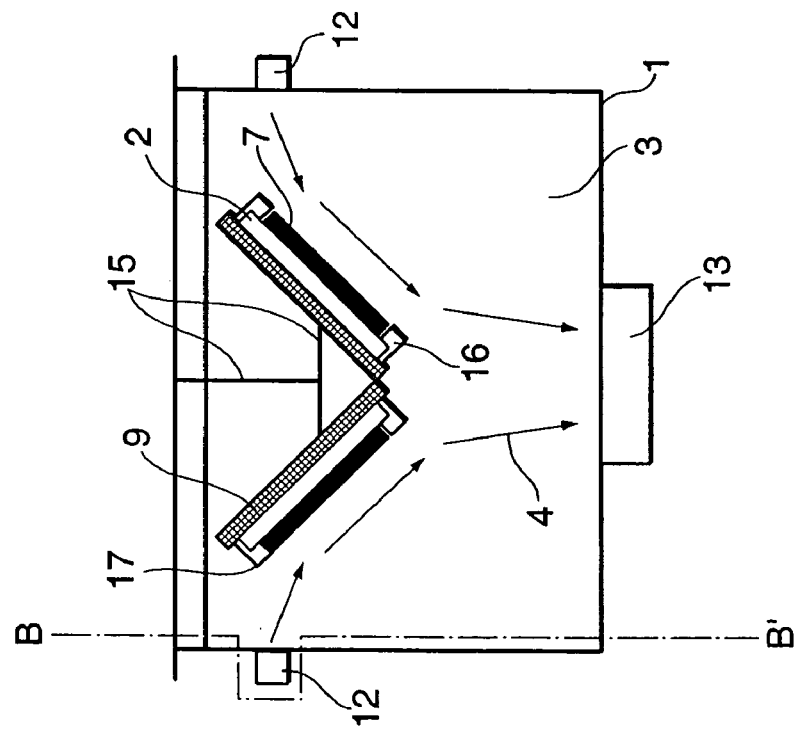

LIFT-OFF METHOD AND CHEMICAL LIQUID TANK

This is a Divisional of U.S. application Ser. No.: 10/262,950, filed Oct. 3, 2002 now U.S. Pat. No. 6,962,630, the subject matter of which is incorporated herein by reference.

BACKGROUND OF THE INVENTION

1. Field of the Invention

The present invention relates to a lift-off procedure and lift-off device capable of reducing a failure in wiring in the lift-off procedure being one of wiring forming processes to form a semiconductor device on a wafer.

2. Description of the Related Art

Conventionally, a lift-off procedure is available as one of methods for forming a semiconductor device.

FIG. 10 is a diagram showing configurations of a conventional lift-off device. In a general lift-off device, as shown in FIG. 10, on an exclusive jig such as a wafer chuck 30 is mounted a wafer 31 with a portion where a metal is adhered and a pattern, is formed being faced upward and a chemical liquid is spewed from a chemical liquid nozzle 32 while the wafer substrate 31 is being rotated to remove unwanted metal together with a resist. Thereafter, in order to wash away unwanted metal, a rinsing liquid is spewed from a rinsing liquid nozzle 33 for cleaning.

Additionally, another conventional lift-off device is also available in which a wafer is put into a tank containing a chemical liquid and unwanted metal, together with a resist, is removed while the tank is being shaken.

However, in the case of the above method shown in FIG. 10, since the portion where a metal is adhered on the wafer is faced upward, when the lift-off procedure is performed, a metal portion being removed from a metal face easily comes into contact with a wiring pattern causing a scratch on the wiring pattern. Moreover, if the lift-off procedure is performed with a pattern face being faced upward, a metal in the course of the lift-off procedure comes into contact with the wiring pattern, which causes the wiring pattern to be scratched in some cases. The scratched wiring produces a defective outward appearance and, since a part of the wiring is scraped out, a problem of migration or a like occurs.

SUMMARY OF THE INVENTION

In view of the above, it is an object of the present invention to provide a lift-off procedure which enables contact between a metal portion to be removed while the lift-off procedure is performed and a wiring pattern to be avoided, an exclusive jig and a chemical liquid tank employed in the above lift-off procedures.

According to a first aspect of the present invention, there is provided a lift-off method comprising a step of:

soaking a wafer having a surface on which a pattern containing a pattern portion to be removed is formed into a chemical liquid to remove the pattern portion to be removed at an angle at which the surface faces downward.

In the foregoing, a preferable mode is one wherein the angle at which the wafer is soaked into the chemical liquid is within a range between 90 degrees to 270 degrees relative to a horizontal line.

Also, a preferable mode is one wherein the step further comprises a step of placing each of a plurality of wafers including the wafer at a wafer cassette to be soaked into the chemical liquid, on which a plurality of wafers are arranged at specified intervals.

Also, a preferable mode is one wherein the step further comprises a step of attaching each of a plurality of wafers including the wafer to a jig to be soaked into the chemical liquid, which has a pressing nail used to partially press the surface of the wafer except the pattern, by the pressing nail.

Also, a preferable mode is one wherein the step further comprises a step of making a flow of the chemical liquid so that the flow is formed in a specified direction on the surface of the wafer.

Also, a preferable mode is one wherein the step further comprises a step of placing each of a plurality of wafers including the wafer at a wafer cassette to be soaked into the chemical liquid, on which a plurality of wafers are arranged at specified intervals.

Also, a preferable mode is one wherein the step further comprises a step of attaching each of a plurality of wafers including the wafer to a jig to be soaked into the chemical liquid, which has a pressing nail used to partially press the surface of the wafer except the pattern, by the pressing nail.

According to a second aspect of the present invention, there is provided a lift-off method comprising steps of:

putting up a trash collecting net to collect a pattern portion to be removed which has been peeled off from a pattern of a wafer in a chemical liquid tank having a columnar shape in a direction reaching an axial center from an internal side wall of the chemical liquid tank and being filled with a chemical liquid used to remove the pattern portion from the wafer having a surface on which a pattern containing the pattern portion to be removed is formed;

attaching the wafer to an internal side wall of the chemical liquid tank so that the surface of the wafer faces inward in the chemical liquid tank; and forming a flow of the chemical liquid in a specified direction on the surface of the wafer.

In the foregoing, a preferable mode is one wherein the step of forming the flow of the chemical liquid further comprises a step of making a flow in the chemical liquid tank so that the flow is formed in the specified direction.

Also, a preferable mode is one wherein the chemical liquid tank is rotated so that the liquid flow is formed in the specified direction.

Also, a preferable mode is one wherein the internal side wall of the chemical liquid tank is in a shape of cylindrical.

According to a third aspect of the present invention, there is provided a chemical liquid tank being filled with a chemical liquid to remove a pattern portion from a wafer having a surface on which a pattern containing a pattern portion to be removed is formed, the chemical liquid tank comprising;

a spewing port from which the chemical liquid is fed; and a sucking port to suck the chemical liquid to have the fed chemical liquid flow in a specified direction.

In the foregoing, a preferable mode is one that further comprising a supporting member to have each of surfaces of a pair of the wafers face outward and to support the wafers in a V-shaped manner.

Also, a preferable mode is one wherein the chemical liquid soak a wafer cassette on which a plurality of the wafers is arranged at specified intervals, further comprises a rectification device used to guide a flow of the chemical liquid in the specified direction, to be flowed from the spewing port through the wafer cassette to the sucking port.

With the above configuration, since a surface of the wafer is placed at an angle within a range between 90° to 270° so that the surface of the wafer faces downward, an unwanted pattern portion hangs down under its own weight in a direction of gravity and, as a result, contact of the unwanted pattern portion with a wiring pattern on the wafer can be avoided, thus enabling damage to wiring to be reduced.

Also, the unwanted pattern portion which has begun lift off from the wafer by a liquid flow travelling in a specified direction toward the metal adhered portion of the wafer hangs down under its own weight and by liquid flow of the chemical liquid and, as a result, contact of the unwanted pattern with the wiring can be avoided and thus damage to the wiring can be reduced. Also, by flowing the chemical liquid, an increase in concentration of impurities such as a resist that have dissolved in the chemical liquid can be prevented in a local portion in the chemical liquid where the lift-off is performed and, as a result, lift-off time can be shortened.

Also, by using a wafer cassette used to perform batch processing on a plurality of wafers and by placing the wafer cassette at an angle within the range described above, effective lift-off processing can be achieved. Moreover, by using a method so that a metal does not adhere to an area being hidden by an eaves of the cassette in the wafer, it is made possible to prevent an wanted metal from being sandwiched between the cassette and wafer and lift-off from being interfered.

Also, since lift-off procedure proceeds, by act of circulation of the chemical liquid, in a specified direction along a direction of the circulation, a risk of contact of a metal in the midcourse of the lift-off procedure with a wiring pattern can be lowered. Furthermore, since a metal drifting in the chemical liquid can be collected by a trash collecting net after the lift-off procedure, contact of the metal with the wiring pattern can be avoided and, as a result, damage to the wiring pattern can be reduced.

BRIEF DESCRIPTION OF THE DRAWINGS

The above and other objects, advantages and features of the present invention will be more apparent from the following description taken in conjunction with the accompanying drawings in which:

FIG. 3(a), FIG. 3(b), FIG. 3(c) and FIG. 3(d) are diagram illustrating a method of a lift-off procedure according to a third embodiment of the present invention;

FIG. 4(a) and FIG. 4(b) are diagrams illustrating a jig exclusively used in a fourth embodiment of the present invention;

FIG. 5(a) and FIG. 5(b) are diagrams explaining a lift-off operation according to a fourth embodiment of the present invention;

DESCRIPTION OF THE PREFERRED EMBODIMENTS

Best modes of carrying out the present invention will be described in further detail using various embodiments with reference to the accompanying drawings.

First Embodiment

Figure 1:
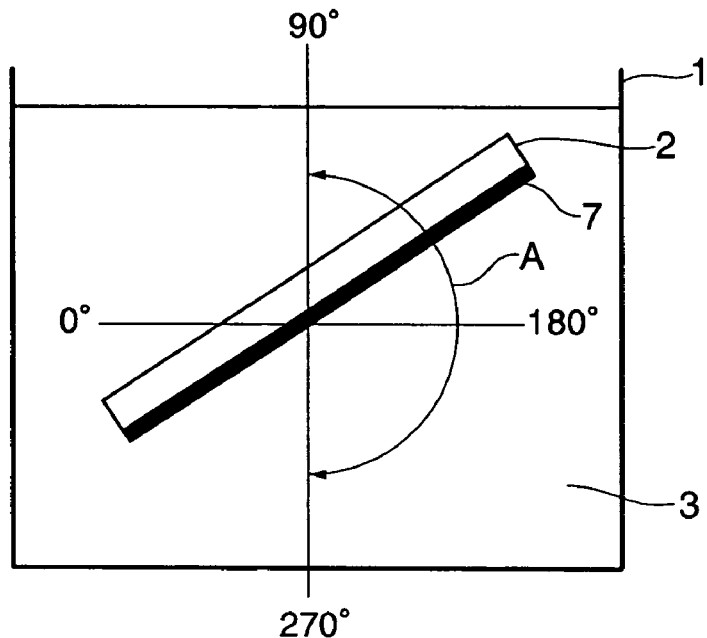
FIG. 1 is a diagram illustrating a method of lift-off procedure according to a first embodiment of the present invention.

FIG. 1 is a diagram illustrating a method of a lift-off procedure of a first embodiment of the present invention. A chemical liquid tank 1 is filled with a chemical liquid 3 which is used to remove an unwanted pattern from a metal adhered portion 7 formed on a surface of a wafer 2 from a pattern containing an unwanted pattern portion to be removed. As shown in FIG. 1, a wafer is soaked in the chemical liquid tank 1 at an angle at which gravity acts on a surface of the wafer 2.

Next, steps of the lift-off procedure are explained. The wafer 2 is soaked in the chemical liquid tank 1 at a specified angle and for a specified period of time. In the example shown in FIG. 1, the wafer 2 is mounted in a manner that a surface of the wafer 2 is positioned on a side on which the metal adhered portion 7 is formed and in a slant and downward manner so that gravity acts on the surface of the wafer 2.

Then, the wafer 2 is taken from the chemical liquid tank 1. The above specified angle is obtained based on a characteristic described later which exhibits a rate of a failure in wiring relative to an angle of a wafer.

Figure 9:
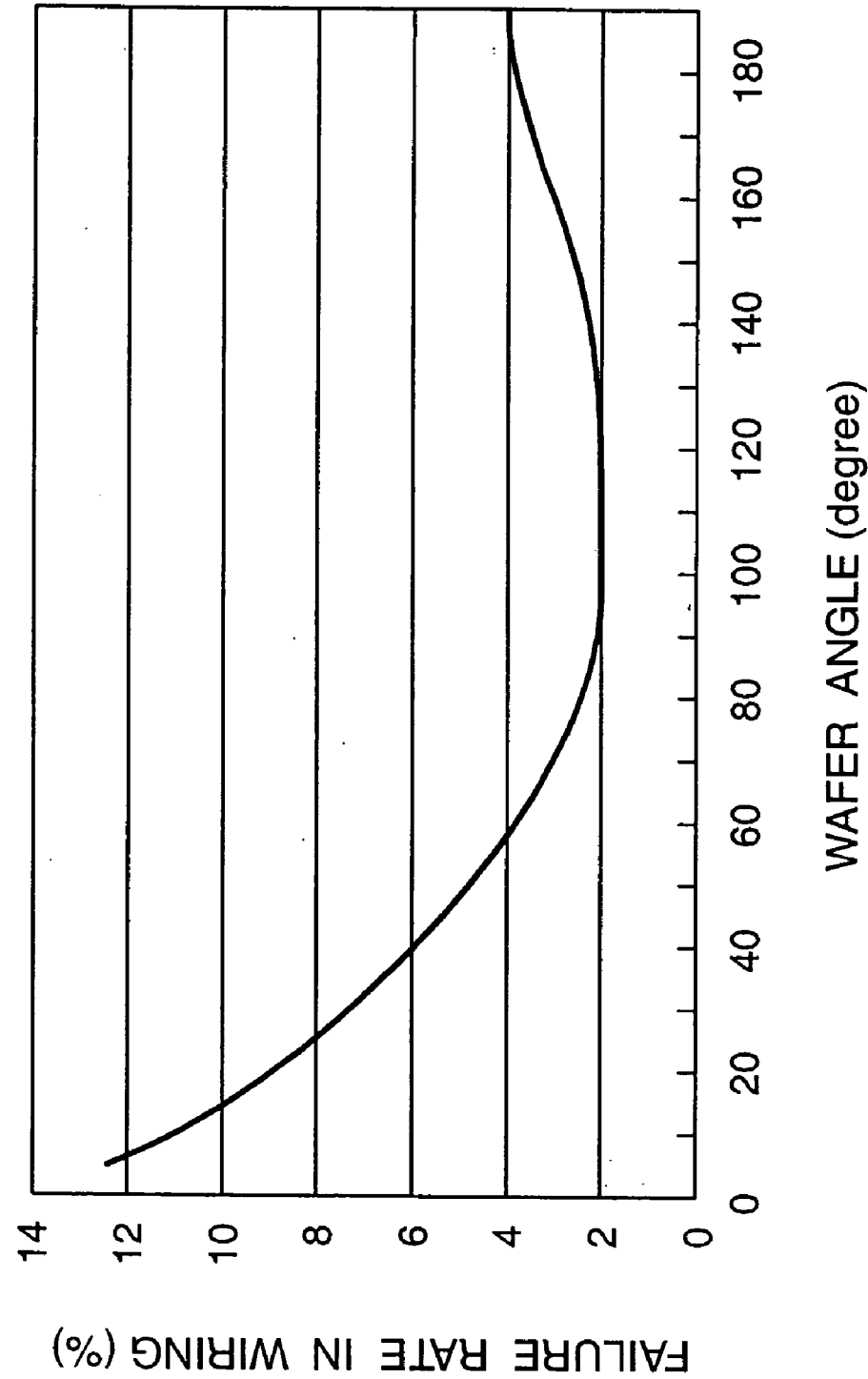
FIG. 9 is a graph showing a rate of a failure in wiring achieved by a lift-off method of the present invention.
Figure 10:
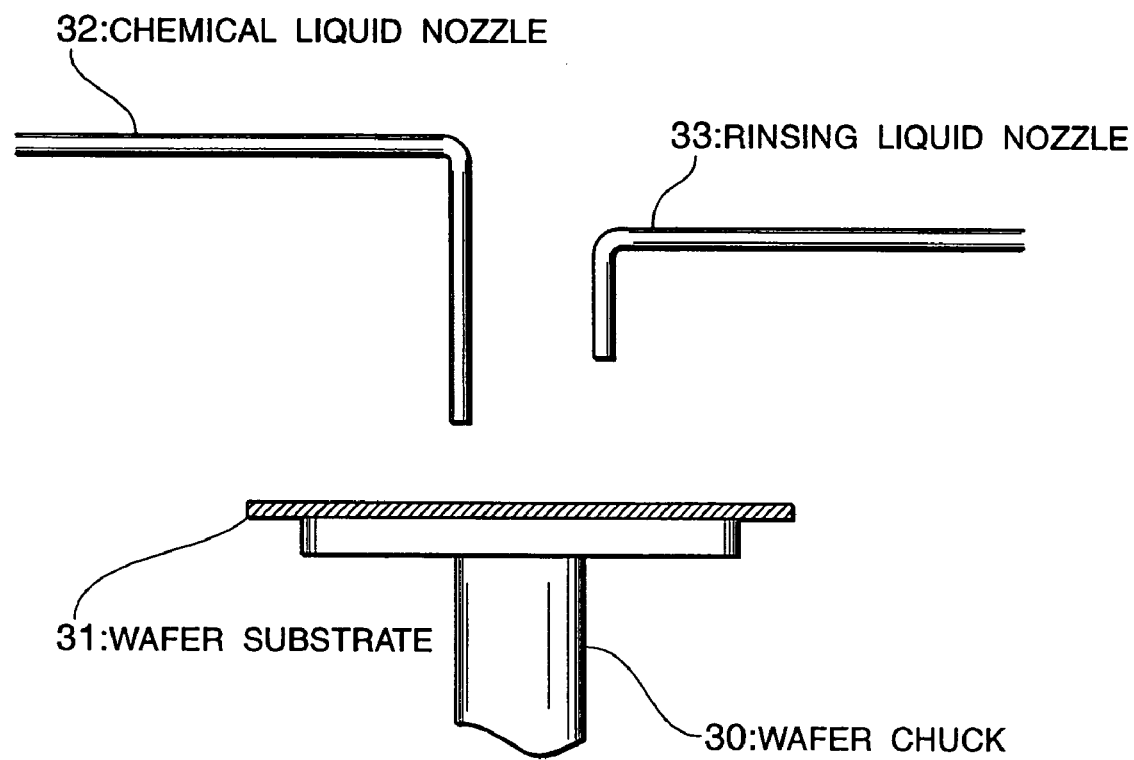
FIG. 10 is a diagram showing configurations of a conventional lift-off device.

FIG. 9 is a diagram showing a characteristic in an experiment using a lift-off method of the present invention, that is, a graph showing a change in a failure rate in wiring relative to an angle at which the wafer 2 is mounted.

In a graph shown in FIG. 9, each of the figures shown in the graph is an average value and Table 1 shows a portion indicating characteristic figures. The degree "0" (0°) in the table indicates that the surface of the wafer is flat and faces upward.

TABLE 1

| Wafer angle | Failure rate in wiring |
| --- | --- |
| 0° | 12.5% |
| 90° | 2.0% |
| 180° | 3.6% |

As shown in Table 1, when an angle of a wafer is 0°, that is, when the wafer 2 is placed so as to face upward and to be in a horizontal state, the failure rate in wiring becomes 12.5%. When the wafer angle is 90°, the failure rate in wiring is 2.0% and when the wafer angle is 180°, the failure rate in wiring is 3.6%. Therefore, in the cases where the wafer angle is 90° or 180°, the failure rate in wiring is lowered remarkably when compared with the case where the wafer angle is 0°.

Moreover, as is apparent from FIG. 9, in a range of the wafer angle being 90° and 180°, the failure rate in wiring is lowered gradually and, in a range of the wafer angle being 90° to 180° at which a position of the wafer becomes horizontal with its surface being faced downward, since gravity acts on the unwanted pattern portion which is peeled from the wafer 2, a peeling effect can be achieved which can be obtained in the conventional technology.

A main reason for the above is that a degree of action of downward force produced by gravity differs by an angle.

Moreover, in a range from 180° to 360° which is not shown in a graph in FIG. 9, from the viewpoint of peeling-off action obtained at angles within the range of 0° to 180°, it is clear that the curve given in the characteristic graph shown in FIG. 9 is turned up.

The above result shows that the wafer 2 is preferably placed at an angle in the range "A" of 180° from 90° through 180° to 270° shown in FIG. 1.

A reason for using the above range of the angle is as follows. In the conventional case, since the wafer is placed in a manner that its surface faces upward to be horizontal at an angle of 0°, peeling of the metal adhered portion 7 is difficult only by being soaked into a chemical liquid and shaking processing or a like is required. In contrast, according to the present invention, by placing a wafer at an angle at which its surface faces downward relative to 90°, when lift-off processing is performed, gravity causes the metal adhered portion 7 being a pattern portion to be removed to hang down in a direction being acted on by gravity and therefore the metal adhered portion 7 can be smoothly peeled off, without requiring the shaking process. Then, while being peeled off, since the unwanted metal adhered portion 7 hangs down mainly in a gravity direction, a scratch on a wiring pattern formed in its vicinity can be prevented.

With the above configurations, by placing the wafer 2 in the chemical liquid tank 1 as described above, the unwanted pattern portion 7 having started lifted off from a surface of the wafer 2 hangs down under its own weight, which serves to facilitate the easy peeling, and therefore contact between the unwanted pattern portion and the wiring pattern is reduced and, as a result, it is possible to reduce damage to the wiring pattern.

Second Embodiment

Figure 2:
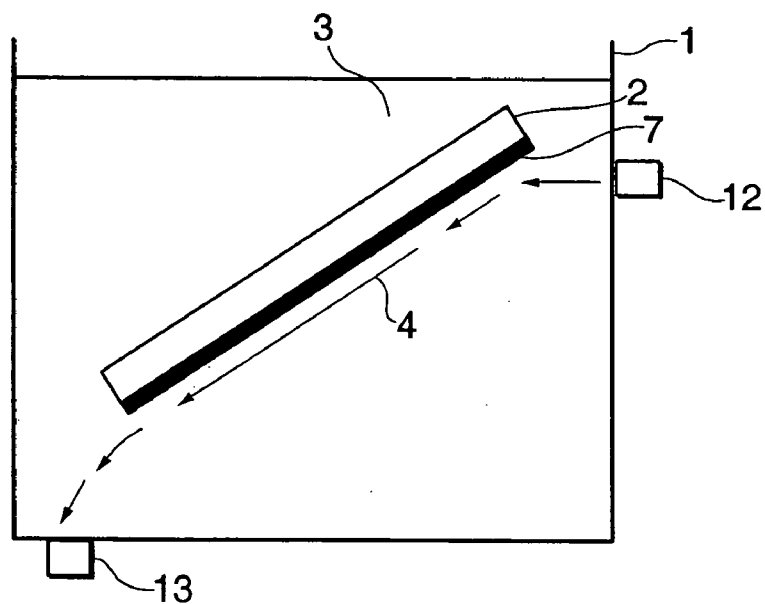
FIG. 2 is a diagram illustrating a method of lift-off procedure according to a second embodiment of the present invention.

FIG. 2 is a diagram illustrating a method of a lift-off procedure of a second embodiment of the present invention. In the second embodiment, as in the case of the first embodiment, a wafer 2 is placed in the chemical liquid tank 1 filled with a chemical liquid 3 at a specified angle at which a surface of a metal adhered portion 7 faces downward in a slant manner. The chemical liquid tank 1 of the second embodiment includes a spewing port 12 used to receive the chemical liquid 3 and a sucking port 13 for sucking the chemical liquid 3 used to have a supplied chemical liquid 3 flow in a specified direction. The spewing port 12 and the sucking port 13 are mounted in such a manner that a flow of the chemical liquid 3 is formed in a specified direction relative to the metal adhered portion 7 of the wafer 2.

The specified angle at which the wafer 2 is placed is, as in the case of the first embodiment, within a range of an angle, that is, between 90° to 270°. The spewing port 12 and sucking port 13 are placed so as to respond to the specified angle.

The "specified direction" of the flow of the chemical liquid 3 denotes a direction in which a vortex does not occur in the flow of the chemical liquid 3 having struck the metal adhered portion 7.

The spewing port 12 and sucking port 13 are so constructed that the flow of the chemical liquid 3 has a width enough to allow the metal adhered portion 7 of the wafer 2 to be covered and have a shape and structure so as to have the chemical liquid 3 flow in a specified direction.

In the lift-off procedure of the second embodiment, the wafer 2 is arranged in the chemical liquid tank 1 in a manner that following two conditions (1) and (2) are satisfied.

(1) To place the wafer 2 in the chemical liquid tank 1 at the specified angle described in the first embodiment so that the metal adhered portion 7 faces downward.

(2) To place the wafer 2 in the chemical liquid tank 1 so that the chemical liquid 3 travelling between the spewing port 12 and sucking port 13 placed in the chemical liquid tank 1 flows in a specified direction along the metal adhered portion 7.

The chemical liquid 3 is flown from the spewing port 12 to the sucking port 13 so that the flow of the chemical liquid 3 travels in a specified direction along the metal adhered portion 7.

After a specified time, the wafer 2 is taken out from the chemical liquid tank 1.

Thus, in the second embodiment, in addition to the method described in the first embodiment, the lift-off procedure is performed while the chemical liquid 3 flows.

According to the second embodiment, since the chemical liquid 3 flows in a specified direction, the metal adhered portion 7 hanging down in a downward direction is induced to be directed to the specified direction which enables an unwanted pattern portion to be easily peeled off. Thus, by placing the wafer 2 in a downward direction and by inducing the pattern portion to hang down in a specified direction, it is possible to prevent damage to a wiring pattern conventionally caused by a shaking process of a wafer.

According to the second embodiment, by placing the wafer 2 in such the way as described above, since an unwanted metal having started to be lifted off from the wafer 2 easily hang down in a downward direction under its own weight or by flowing of the chemical liquid 3, contact of the unwanted metal with a wiring pattern is reduced and, as a result, damage to the wiring can be prevented. Moreover, by having the chemical liquid 3 flow in such the manner as described above, since an increase in the concentration of impurity such as a resist or a like having dissolved in the chemical liquid 3 in a local portion on which the lift-off procedure is performed can be inhibited, lift-off time is shortened.

Third Embodiment

FIG. 3(a), FIG. 3(b), and FIG. 3(c) are diagrams illustrating a method of a lift-off procedure according to a third embodiment of the present invention. In the third embodiment, a lift-off procedure is carried out by performing batch processing on a plurality of pieces of wafers.

FIG. 3(a) is a diagram explaining operations of the lift-off procedure. FIG. 3(b) is a cross sectional view of a cassette case with wafers being mounted of FIG. 3(c) taken along a line A—A. FIG. 3(c) is a cross sectional view of the cassette case, with wafers being mounted, of FIG. (b) taken along a line B—B. FIG. 3(d) is a bottom plan view in FIG. 3(d).

Steps of the procedure in the third embodiment will be explained.

As shown in FIG. 3(b) and FIG. 3(c), a plurality of pieces of wafers on which the lift-off procedure is to be performed is placed in a general-type wafer cassette 8 being configured to be opened at its one end such as A82M manufactured by Fluoroware Corp., or a like.

At this point, a portion 6 of the wafer 2 shown in FIG. 3(d) to which a metal is not adhered is placed on an eaves 5 so that the metal adhered portion 7 facing downward is inserted between a pair of eaves 5 mounted at equal intervals from an upper to lower portions on a wall side of the wafer cassette 8, as shown in FIG. 3(c).

The wafer cassette 8 having the wafers 2 is placed into the chemical liquid tank 1 at a specified angle.

The chemical liquid tank 1 includes a plurality of spewing ports 23 adapted to supply a chemical liquid 3 into the chemical liquid tank 1 and a sucking port 24 adapted to suck the supplied chemical liquid 3. The plurality of the spewing ports 23 are mounted on a wall side of the chemical liquid tank 1 in an aligned manner. The sucking port 24 is attached to a bottom wall on the chemical liquid tank 1.

The above wafer cassette 8 is placed at a specified angle relative to the spewing port 23 in such a manner that a flow 4 of the chemical liquid 3 spewed from the above spewing port 23 travels along the metal adhered portion 7 of the wafer 2 facing downward. The liquid flow 4 having passed through the wafer cassette 8 is sucked into the sucking port 24 in a sucking direction to the sucking port 24.

The wafer cassette 8 is placed at an angle that does not disturb the flow of the chemical liquid 3, that is, at an angle that does not produce a vortex in the flow of the chemical liquid 3. This causes the lift-off procedure on the metal adhered portion 7 to proceed almost equally on each of the wafer 2 in the wafer cassette 8.

Next, lift-off procedure employed in the embodiment is described. As shown in FIG. 3(a), the wafer cassette 8 having a plurality of pieces of wafers 2 is placed in the chemical liquid tank 1 at a specified angle.

The liquid flow 4 that has been diverted for every wafer 2 from each of spewing ports 23 is formed in the metal adhered portion 7 in a specified direction in which the vortex does not occur and, while the liquid flow 4 strikes the metal adhered portion 7, travels along the metal adhered portion 7. The liquid flow 4 spewed from the wafer cassette 8 is sucked into the sucking port 24.

Since each of the wafers 2 is attached to the wafer cassette 8 in such a manner that gravity acts on the metal adhered portion 7, an unwanted portion of the pattern on the wafer 2 starts to be peeled off from a corner of the wafer cassette 7 by the liquid flow 4 and then gradually and increasingly by further continued liquid flow 4 and, as a result, hangs down by gravity. Moreover, the liquid flow 4 travelling in a specified direction acts on a portion hanging down which causes the portion hanging down to be peeled off apace.

Since the liquid flow 4 is controlled so as to travel in a specified direction in the chemical liquid tank 1, damage to wiring pattern existing in a vicinity of the unwanted pattern caused by the portion hanging down is effectively inhibited.

Setting is made possible in a manner that such the flow of the chemical liquid 3 occurs according to a need. At this point, as shown in FIG. 3(d), the wafer 2 is preferably placed in a manner that the metal does not adhere physically to an area 6 being hidden by an eaves 5. For example, when the metal is formed by a deposition device, deposition is performed with the area 6 being hidden by the eaves 5 being masked.

Thus, according to the third embodiment of the present invention, even if lift-off procedure is performed by batch processing of a plurality of pieces of wafers, same effects obtained in the first and second embodiments can be achieved. Moreover, as described above, by taking a measure so that an unwanted metal does not adhere to an area being hidden by an eaves on the wafer, it is made possible to prevent lift-off procedure from being interfered by unwanted metal being sandwiched between a substrate of the wafer and the eaves on the wafer cassette.

Modified Embodiment of Third Embodiment

Figure 8:
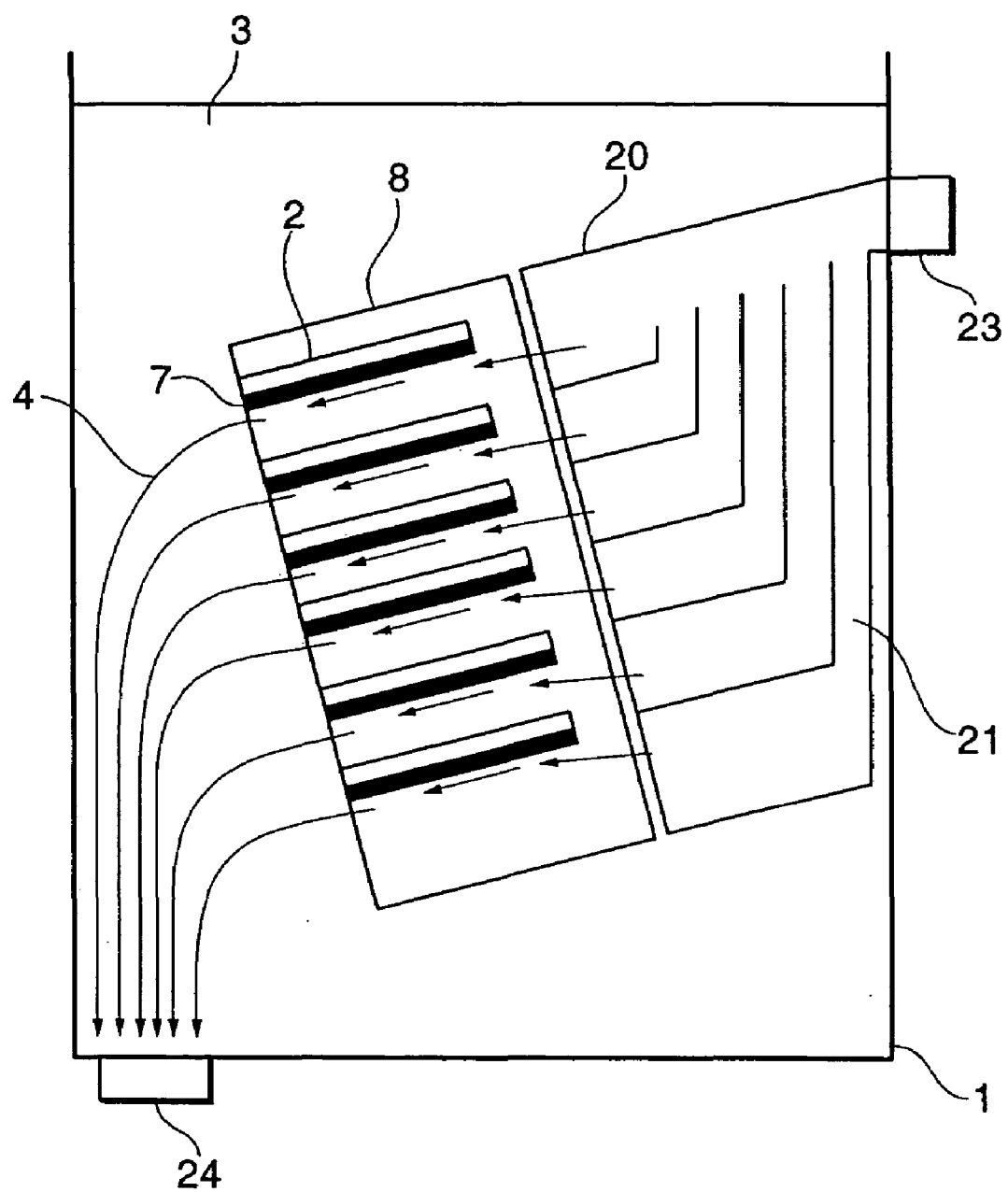
FIG. 8 is a side view illustrating a method of lift-off procedure according to modified embodiment of the third embodiment of the present invention.

FIG. 8 is a side view illustrating a method of lift-off procedure according to modified embodiment of the third embodiment of the present invention. In the modified embodiment of the third embodiment, as in the case of the third embodiment, batch processing is performed on a plurality of pieces of wafers 2. The method employed in the modified embodiment differs from that used in the third embodiment in that a rectification device 20 is mounted in the chemical liquid tank 1.

Next, lift-off procedure employed in the embodiment is described below.

As in the case of the third embodiment, a wafer cassette 8 in which a plurality of wafers 2 is placed is attached to the rectification device 20 in the chemical liquid tank 1 as shown in FIG. 8.

The rectification device 20 includes a spewing port 23 to spew a chemical liquid 3 fed from a device (not shown) used to form a liquid flow 4 and a diverting pipe 21 having a plurality of exits used to form the liquid flow 4 to each of wafers 2 connecting to the spewing port 23. Each of exits of the diverting pipe 21 is so constructed that a vortex flow is not produced by contact of the liquid flow 4 with the metal adhered portion 7. The rectification device 20 is placed in a vicinity of the wafer cassette 8 so that the liquid flow 4 is not disturbed. The sucking port 24 is provided in the chemical liquid tank 1 to form a natural flow of the chemical liquid 3.

The liquid flow 4 of the chemical liquid 3 shown in FIG. 8 travels in a manner that it forms an approximately S-shaped flow and, therefore, a speed of the liquid flow 4 travelling through an upper step of the wafer cassette 8 becomes almost equal to that of the liquid flow 4 travelling through a lower step of the wafer cassette 8. Therefore, a speed, liquid pressure, and amount of the liquid flow 4 striking the metal adhered portion 7 among wafers 2 become almost equal to one another and the lift-off procedure in the wafer cassette 8 proceeds in the same ways accordingly.

Next, lift-off procedure employed in the embodiment is described. As shown in FIG. 8, the wafer cassette 8 on which a plurality of pieces of wafers 2 is placed is mounted on the rectification device 20 in the chemical liquid tank 1.

The chemical liquid 3 is flown from the spewing port 23 into the diverting pipe 21 with pressure. The liquid flow 4 diverted to each of the wafers 2 by the diverting pipe 21 is rectified in a specified direction in which a vortex occurs in the metal adhered portion 7 of each wafer 2, while striking the metal adhered portion 7, travels along the metal adhered portion 7. The liquid flow 4 having passed through the wafer cassette 8 is sucked into the sucking port 24.

As described above, the liquid flow 4 formed in the chemical liquid tank 1 strikes corners of the metal adhered portion 7 and has the metal adhered portion 7 be peeled off. The peeled portion is further peeled off by subsequent liquid flow 4.

Since each of the wafers 2 is placed on the wafer cassette 8 in a manner that gravity acts on the metal adhered portion 7, an unwanted metal portion of the peeled-off wafer 2 hangs down due to the gravity. The liquid flow 4 acts on the portion hanging down in a specified direction, thus causing the portions hanging down to be peeled off rapidly. Since the liquid flow 4 is formed in a specified direction, it is possible to effectively prevent a wiring pattern existing in the vicinity of the metal adhered portion 7 from being damaged by the portion hanging down.

As in the case of the third embodiment, setting is made possible in a manner that such the flow of the chemical liquid 3 occurs according to a need. At this point, it is desirous to place the wafer 2 in a manner that the metal does not adhere physically to an area being hidden by an eaves 5. For example, when the metal is formed by a deposition device, deposition is performed with the area being hidden by the eaves 5 being masked.

Next, effects by the modified embodiment of the third embodiment are described. Same effects obtained in the first to third embodiments may be achieved in the modified embodiment of the third embodiment as well. Moreover, a speed, liquid pressure, and amount of the liquid flow 4 striking the metal adhered portion 7 among wafers 2 can be made almost equal to one another.

Fourth Embodiment

A fourth embodiment will be described by referring to FIG. 4 to FIG. 5. In the fourth embodiment, an example in which batch processing is performed on a plurality of pieces of wafers. FIG. 4(a) and FIG. (b) are diagrams showing configurations of a jig exclusively used in the fourth embodiment of the present invention.

FIG. 5 is a diagram explaining a lift-off operation of the fourth embodiment of the present invention. FIG. 5(a) is a cross-sectional view of a chemical liquid tank 1 seen from a spewing port 12 in FIG. 5(b), taken along a line A–A'. FIG. 5(b) is a cross-sectional view of the chemical liquid tank 1 in FIG. 5(a) taken along a line B–B'.

In the fourth embodiment, as in the third embodiment, a method of batch processing to be performed to carry out the lift-off procedure on a plurality of pieces of wafers 2 and its device are provided.

The exclusive jig 9, as shown in FIG. 4(a) and FIG. 4(b), includes a substrate 18 having a size of a wafer being larger than that of the wafer 2. As shown in FIGS. 4(a) and 4(b), a wafer pressing nail 16 is placed in an upper position and at a left and right positions on a surface of the substrate 18 and a wafer pressing nail 17 is placed in a lower position. The wafer pressing nail 17 being placed in the lower position and being formed so as to have a large width and to be dividable is adapted to partially press a portion 6 to which a metal is not adhered on a side making up a partially lacking portion of a wafer's circular shape. Moreover, the wafer pressing nail 16 being formed so as to be narrower than that of the wafer pressing nail 17 is adapted to partially press another portion 6 having no metal on the wafer 2. One of the divided member of the wafer pressing nails 16 and 17 is fixed to the substrate 18 and is connected to another divided member of the wafer pressing nails 16 and 17 while pressing the wafer 2.

As shown in FIG. 4(a), the exclusive jig 9 shown in FIG. 4(a) is attached to a H-shaped supporting member and the wafer 2 is soaked in the chemical liquid tank 1 with the metal adhered portion 7 being faced downward in a manner that gravity acts on the metal adhered portion of the wafer 2. At this point, as shown in FIG. 5(b), a pair of a measuring rule—shaped spewing ports 12 adapted to cover all pieces of wafers 2 on the supporting member 15 being arranged in parallel is mounted in an upper portion on a wall side of the chemical liquid tank 1 and a sucking port 13 is mounted at a bottom of the chemical liquid tank 1 in a manner that the liquid flow 4 strikes the metal adhered portion 7 and then flows in a specified direction to be sucked in the sucking port 13. A collecting device (not shown) used to collect unwanted resists and metal films having peeled from the wafer 2 is embedded at the sucking port 13.

Next, lift-off processing employed in the embodiment is described. As shown in FIG. 5(a), the exclusive jig 9 is attached to the supporting member 15 in a manner that the metal adhered portions 7 on a pair of the wafers 2 are V-shaped which face outside and, by using the supporting member 15, the exclusive jig 9 is soaked in the chemical liquid tank 1.

By having the liquid flow 4 travel from the spewing port 12 to the sucking port 13 and by having the liquid flow 4 act, in a specified direction, on the resists and/or unwanted patterns hanging down in a direction of gravity, the resists and/or unwanted wirings are peeled off from the wafer 2.

When the lift-off procedure of the fourth embodiment is performed, in order to form the liquid flow 4 that travels toward the metal adhered portion 7 in a specified direction, as shown in FIG. 5(a), an angle for attaching an exclusive jig 9 to the supporting member 15, a direction of the metal adhered portion 7, a position of the spewing port 12 and sucking port 13, a speed of spewing the chemical liquid 3, an amount of a spewed liquid, or a like are adjusted.

As FIGS. 5(a) and 5(b) show, wafers 2 are deployed side-by-side (and preferably coplanar) in a generally horizontal row with each wafer slanted at an angle with respect to the downward direction. The arrows indicate that the chemical liquid 3 is spewed from the spewing port 12 onto an upper portion of the downward-facing wafer surface of each wafer surface containing the pattern portion 7 to be removed, thereby producing a flow of the chemical liquid 3 in a specified direction along the surface of the wafer (indicated by the arrows perpendicular to the downward-facing surfaces of the wafers 2). These figures also show that the spewing ports 12 are aligned horizontally and level with the upper edge of the wafer 7, and that the suction port 13 is below the lower edges of the wafers; and they further show that the spewing ports 12 and the suction port 13 are on the outside of the tank 1 and convey the chemical liquid 3 from or to the outside of the tank 1. (FIG. 2 also shows spewing ports 12 aligned horizontally and level with the upper edge of the wafer 2 and with a horizontal jet indicated by the arrow from the port 12, and shows ports 12 and 13 on the outside of the wall of the tank 1 to convey the chemical liquid 3 from or to the outside of the tank 1). FIG. 5(a) shows that a second row of wafers 2 and a second spewing port 12 are placed symmetrically relative to a first row of wafers 2 and a first spewing port 12, and FIG. 5(b) shows that the spewing port 12 has a length substantially equal to a length of the row.

Moreover, as shown in FIG. 4(a), the wafer 2 is set to the exclusive jig 9 having a greatly expanded contact area between the chemical liquid 3 and the wafer 2, and the exclusive jig 9 is soaked into the chemical liquid 3 with the wafer 2 being faced slant and downward so that gravity acts on a surface of the wafer 2 and an unwanted pattern is lifted off. Setting is made possible in a manner that such the flow of the chemical liquid 3 occurs according to a need.

Thus, according to the fourth embodiment, same effects obtained in the third embodiment can be achieved and moreover a valid area for the lift-off procedure in the wafer 2 can be ensured.

Fifth Embodiment

Figure 6:
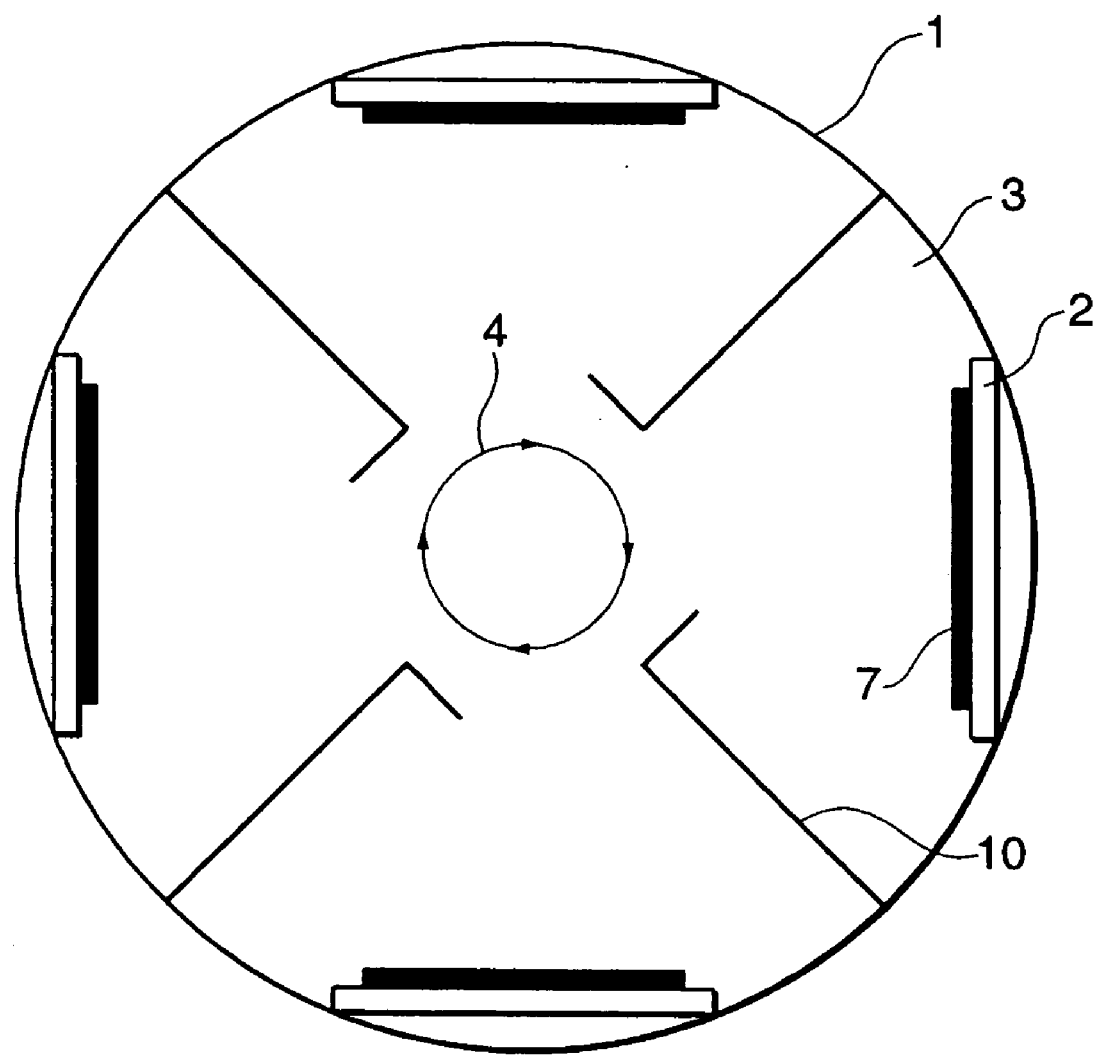
FIG. 6 is a plan view explaining a method of a lift-off procedure according to a fifth embodiment of the present invention.

A fifth embodiment will be described by referring to FIG. 6. FIG. 6 is a plan view explaining a method of the lift-off procedure according to a fifth embodiment of the present invention.

As shown in FIG. 6, the chemical liquid tank 1 is so configured that, at least, its internal side wall is cylindrical and a plurality of pieces of wafers 2 are placed on the side wall so that they are freely detachable. Each of the wafers 2 is attached in such a manner that its metal adhered portion 7 faces toward a center of the chemical liquid tank 1. On the side wall of the chemical liquid tank 1 is attached a plurality of trash collecting nets 10 having a mesh-like shape being put up in a direction toward a center of the chemical liquid tank 1 and each of the wafers 2 is placed among trash collecting nets. The trash collecting net 10 may be made from a synthetic resin, metal or a like and has a function of collecting resists or unwanted metal films floating in the chemical liquid 3 after it had been peeled from the wafer 2 and of preventing a necessary wiring pattern on the wafer 2 from being damaged. In a center of the chemical liquid tank 1 is placed a flow generating unit such as a screw (not shown), moving blade (not shown) or a like which forms a liquid flow 4 rotating in one direction as shown in FIG. 6. A speed of the liquid flow 4 produced by the flow generating unit and a diameter of an aperture of a mesh of the trash collecting net 10, or a like are determined and set in a manner that the chemical liquid 3 travelling along the metal adhered portion 7 flows in a specified direction.

Next, lift-off processing employed in the embodiment is described. The wafer 2 is attached in a manner that the metal adhered portion 7 faces toward a center of the chemical liquid tank 1 in the cylindrical chemical liquid tank 1.

The metal adhered portion 7 on the wafer 2 is peeled off, beginning with its part existing on a side where it is struck by the liquid flow 4. The peeled-off portions are further expanded by the continued liquid flow 4 and are finally separated. The peeled-off unwanted metal films or resists that have not dissolved in the chemical liquid 3 are ridden on the liquid flow 4 and then collected finally by the trash collecting net 10.

Thus, according to the fifth embodiment, since lift-off procedures are facilitated in one direction along the liquid flow 4 by circulation of the chemical liquid 3 caused by the liquid flow 4, a risk of contact of a metal being in a midcourse of the lift-off procedure with a wiring pattern can be reduced. Moreover, by collecting, using the trash collecting net 10, the metal drifting in the chemical liquid 3 after the lift-off procedure, contact of the metal with the wiring pattern can be avoided. As a result, damage to the wiring pattern can be reduced accordingly.

Sixth Embodiment

Figure 7:
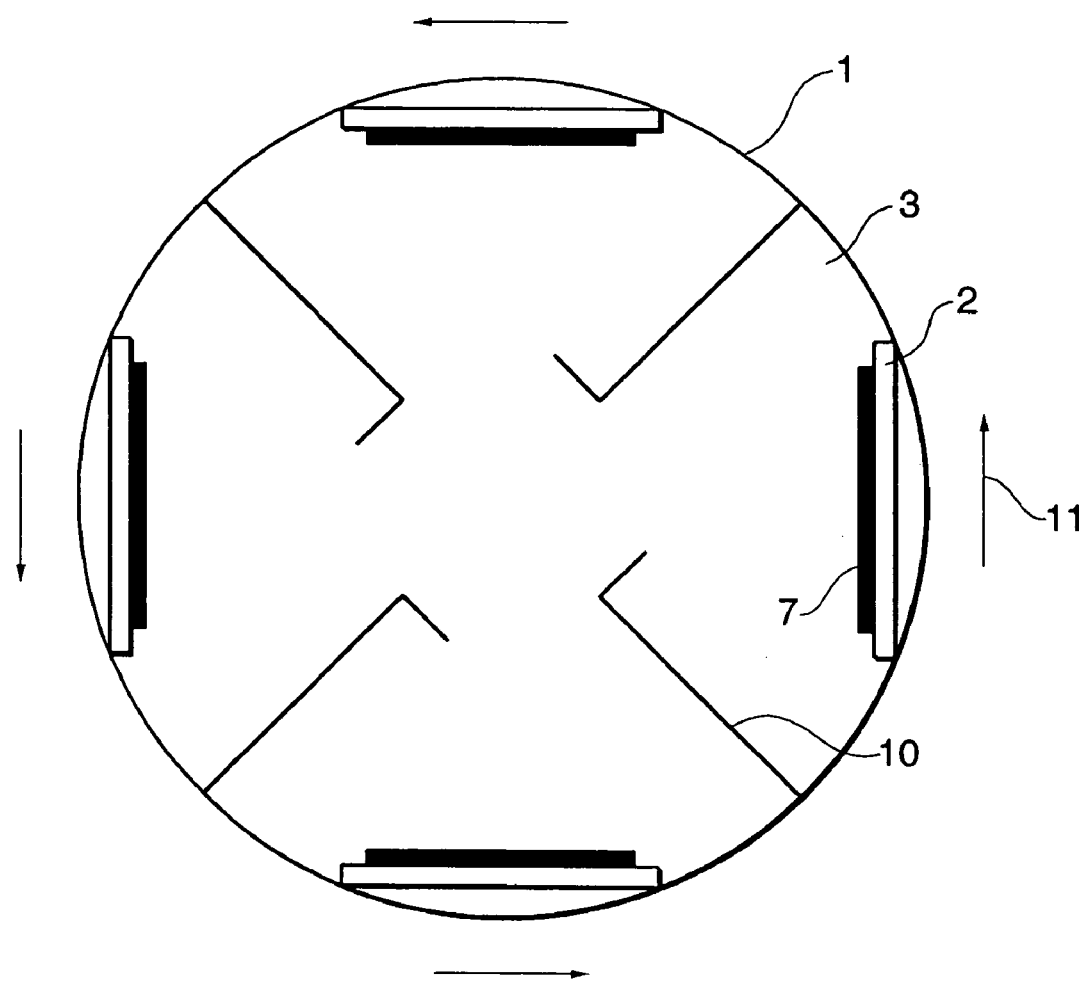
FIG. 7 is a plan view explaining a method of a lift-off procedure according to a sixth embodiment of the present invention.

FIG. 7 is a plan view explaining a method of a lift-off procedure according to a sixth embodiment of the present invention. Unlike in the case of the above fifth embodiment, the chemical liquid 3 in the cylindrical chemical liquid tank 1 is circulated, in the sixth embodiment, the cylindrical chemical liquid tank 1 itself is rotated.

The chemical liquid tank 1, as shown in FIG. 1, is constructed that, at least, its internal side wall is cylindrical and the wafer 2 is attached to its side wall or its cylindrical jig in a manner that it is freely detachable. Each of the wafer 2 is attached in a manner that its metal adhered portion 7 faces toward a center of the chemical liquid tank 1. To the side wall of the chemical liquid tank 1 is attached a plurality of trash collecting net 10 having a mesh-like shape each facing toward the center of the chemical liquid tank 1 and the wafer 2 is placed among the trash collecting nets 10. The trash collecting net 10 is made of a synthetic resin, metal, or a like and collects unwanted metal films and resists having peeled off from the wafer 2 and serves not to cause damage to necessary wirings on the wafer 2. The chemical liquid tank 1 or cylindrical jig, as shown in FIG. 7, is provided with a rotating unit (not shown) used to rotate the chemical liquid tank 1 in one direction.

The chemical liquid tank 1 is designed so that a surface of each of the wafers 2 receives a constant resistance by rotation of the chemical liquid tank 1 in a specified direction 11 shown in FIG. 7.

Next, lift-off procedure employed in the embodiment is described. The wafer 2 is attached to the side wall or cylindrical jig among the trash collecting nets 10 in the cylindrical chemical liquid tank 1 so that the metal adhered portion 7 faces toward the center of the chemical liquid tank 1.

The chemical liquid tank 1 is rotated in a specified direction 11 which causes an end of an unwanted pattern of the metal adhered portion 7 to curl up by continued receipt of resistance of the chemical liquid 3 and the curled-up portion receives larger resistance which makes the unwanted pattern be finally peeled off.

The unwanted metal film having been peeled off by the above method is collected by the trash collecting net 10 in the chemical liquid tank 1.

According to the sixth embodiment, by rotating the chemical liquid tank 1, the same act of circulation of the chemical liquid 3 as in the case of the fifth embodiment can be produced and, therefore, the lift-off operations proceed in a specified direction being reverse to a direction of rotation of the chemical liquid tank 1 which enable reduction in a risk that the metal being in the midcourse of the lift-off procedure comes into contact with the wiring pattern. Moreover, by collecting a metal drifting in the chemical liquid 3 using the trash collecting net 10 after it has been peeled off, contact of the metal with the wiring can be avoided and, as a result, damage to a wiring pattern can be reduced.

Other Embodiment

In the first to fourth embodiments, the wafer 2 on which the metal adhered portion 7 is soaked in the chemical liquid 3 with a surface of the wafer 2 facing toward a slant and downward direction. In the other embodiment, the wafer 2 may be placed at an arbitrary angle within a range between 90° to 270° so that the surface of the wafer 2 faces downward. Moreover, in the fifth to sixth embodiment, the chemical liquid tank 1 having a cylindrical internal side wall is used, however, a chemical liquid tank, when seen from an upper surface, that is, in its plan view, so long as it is circular or polygonal being near to a circular shape and so long as it is constructed in a manner that the chemical liquid 3 circulates in a constant direction and that a vortex does not occur, can be employed as well, which can provide same effects as obtained in the fifth to sixth embodiment can be achieved.

Next, an example of processes for incorporating the above embodiment is explained.

TABLE 2

| LD | First tank | Second tank | Third tank | Spin | UL |
|---|---|---|---|---|---|
| Chemical liquid condition | DMF Face Down Without shaking 120 minutes (Semi-automatic) | DMF Face Up With shaking 15 minutes (Full automatic) | IPA Face Up With shaking 3 minutes | IPA washing | |

As shown in the example of processes in Table 2, in the first tank process, DMF (Dimethylforamide) is used as a chemical liquid 3 and the wafer 2 is in a "Face Down" state, that is, the wafer 2 is placed in a manner that its metal adhered portion 7 faces downward and is then soaked in the chemical liquid 3 for 120 minutes without being shaken, and a flow of the chemical liquid 3 is produced in a constant direction. In the first tank process, the same steps as used in the third embodiment can be employed. By performing the first tank step prior to the process of shaking, a larger part of unwanted pattern portions is removed and, as a result, in subsequent process of the shaking process, lift-off procedures can be performed without causing almost no damage to the wiring pattern.

In the second tank step following the above first tank step, the DMF is used and the wafer 2 is soaked into the chemical liquid 3 for 15 minutes with the wafer 2 being in a "Face Up" state, that is, with the metal adhered portion 7 being faced upward while being shaken.

In the third tank process subsequent to the second tank process, IPA (Isopropyl Alcohol) is used and the wafer 2 is soaked into the chemical liquid 3 with the wafer 2 being in a "Face Up" state while being shaken.

Finally, the wafer 2 is washed with IPA while being spun In the above example of processes shown in Table 2, the method used in the first tank process is employed as the first tank process. However, instead of this, any method used in the first to second embodiment and in the fourth to sixth embodiment may be employed.

Moreover, in the second and third tanks in the example of processes shown in Table 2, operations of shaking the wafer 2 with the wafer 2 being in the "Face Up" state are added, however, instead of this, the wafer 2 may be soaked with it being in the "Face Up" state without operations of shaking the wafer 2. Moreover, a process of forming a liquid flow can be added.

A number of processes and order of processes for the lift-off are not limited to the process example shown in Table 2 and they can be designed in an arbitrary manner, however, it is preferable that the processes used in the above embodiment are incorporated into the first process of the lift-off procedures.

It is thus apparent that the present invention is not limited to the above embodiments but may be changed and modified without departing from the scope and spirit of the invention.

What is claimed is:

1. A lift-off method for wafers each having a surface on which is a pattern containing a pattern portion to be removed; the method comprising steps of:
    deploying the wafers, immersed in a tank full of chemical liquid, side-by-side in a generally horizontal first row with each wafer at an angle at which said surface faces downward and is slanted at an angle with respect to the downward direction;
    providing a first spewing port;
    providing a second spewing port;
    deploying a second row of wafers arranged similarly to the first row of wafers, wherein the first row of wafers and the first spewing port are placed symmetrically relative to the second row of wafers and the second spewing port, whereby the first row of wafers and the second row of wafers form a V-shape;
    spewing the chemical liquid from outside the tank through the spewing ports onto an upper portion of the downward-facing surface of each wafer containing the pattern portion to be removed, thereby producing a flow of the chemical liquid in a specified downward-slanted direction along the surface of the wafer;
    providing a sucking port adjacent to a lower portion of the downward-facing wafer surfaces, said sucking port being at a lower elevation than the spewing ports;
    collecting the spewed chemical liquid at said sucking port; and
    conveying the chemical liquid to the outside of the tank from said sucking port.

2. The lift-off method according to claim 1, wherein each spewing port has a length substantially equal to a length of the respective row.

3. The lift-off method according to claim 1, wherein a line perpendicular to a surface of said wafer is at an angle greater than 0 degrees and less than 90 degrees relative to a horizontal line.

4. The lift-off method according to claim 1, comprising providing a wafer cassette, and wherein said step of spewing further comprises a step of placing each of a plurality of wafers including said wafer in said wafer cassette to be soaked with said chemical liquid, and arranging said plurality of wafers at a specified interval.

5. The lift-off method according to claim 1, comprising
    providing a jig, and wherein said step of spewing further comprises a step of attaching each of a plurality of wafers including said wafer to said jig to be soaked with said chemical liquid, wherein said jig comprises a pressing nail, and
    partially pressing said surface of said wafer except said pattern, by said pressing nail.

6. The lift-off method according to claim 1, comprising deploying the spewing port horizontal and level with an upper wafer edge, and deploying the suction port below a lower wafer edge.

7. The lift-off method according to claim 1, wherein the wafers are generally coplanar within each row.

8. The lift-off method according to claim 1, wherein gravity aids the flow along the specified direction.

9. The lift-off method according to claim 1, wherein the specified direction is a direction in which no vortex occurs in the flow of the chemical liquid striking a metal adhered portion to be removed.

10. A lift-off method for a wafer having a surface on which is a pattern containing a pattern portion to be removed; the method comprising steps of:
    deploying the wafer, immersed in a tank full of chemical liquid, at an angle at which said surface faces downward and is slanted at an angle with respect to the downward direction;
    providing a spewing port;
    spewing the chemical liquid from outside the tank through the spewing port onto an upper portion of the downward-facing surface of the wafer containing the pattern portion to be removed, thereby producing a flow of the chemical liquid in a specified downward-slanted direction along the surface of the wafer, whereby gravity aids the flow along the specified direction;
    providing a sucking port adjacent to a lower portion of the downward-facing wafer surfaces, the sucking port being at a lower elevation than the spewing ports; and
    collecting the spewed chemical liquid at said sucking port.

11. The lift-off method according to claim 10, wherein gravity aids the flow along the specified direction.

12. The lift-off method according to claim 10, wherein a line perpendicular to a surface of said wafer is at an angle greater than 0 degrees and less than 90 degrees relative to a horizontal line.

13. The lift-off method according to claim 10, comprising providing a wafer cassette, and wherein said step of spewing further comprises a step of placing each of a plurality of said wafer in said wafer cassette to be soaked with the chemical liquid, and arranging said plurality at a specified interval.

14. The lift-off method according to claim 10, comprising providing a jig comprising a pressing nail, and attaching the wafer to said jig by said pressing nail pressing said surface of said wafer except said pattern, and soaking the wafer with the chemical liquid in the jig.

15. The lift-off method according to claim 10, comprising deploying the spewing port level with an upper wafer edge and jetting horizontally onto the upper wafer edge, and deploying the suction port below a lower wafer edge.

16. The lift-off method according to claim 10, wherein the specified direction is a direction in which no vortex occurs in the flow of the chemical liquid striking a metal adhered portion to be removed.

* * * * *